United States Patent [19]

Kakizaki

[11] Patent Number: 5,011,041

[45] Date of Patent: Apr. 30, 1991

[54] BASKET FOR PROCESSING THIN PLATES

[75] Inventor: Takeyoshi Kakizaki, Houya, Japan

[73] Assignee: Kakizaki Mfg. Co., Ltd., Tokyo, Japan

[21] Appl. No.: 406,569

[22] Filed: Sep. 13, 1989

[30] Foreign Application Priority Data

Sep. 14, 1988 [JP] Japan .................................. 63-228450

[51] Int. Cl.⁵ .............................................. B65D 85/57
[52] U.S. Cl. ..................................... 220/507; 220/555; 220/676; 118/500
[58] Field of Search ...................... 220/20, 21; 118/500

[56] References Cited

U.S. PATENT DOCUMENTS

| | | | |
|---|---|---|---|
| 3,442,395 | 5/1969 | Taylor | 220/21 |
| 3,610,613 | 10/1971 | Worden | 269/254 |
| 3,756,383 | 9/1973 | Kryter | 220/20 |
| 3,934,733 | 1/1976 | Worden | 118/500 |
| 3,949,891 | 4/1976 | Butler | 118/500 |
| 4,160,504 | 7/1979 | Kudlich et al. | 206/334 |
| 4,248,346 | 2/1981 | Johnson | 206/334 |
| 4,471,716 | 9/1984 | Milliren | 118/500 |
| 4,718,549 | 1/1988 | Rissotti | 118/500 |
| 4,741,438 | 5/1988 | Mastronardo | 220/21 |

Primary Examiner—Stephen Marcus
Assistant Examiner—S. Castellano
Attorney, Agent, or Firm—Fleit, Jacobson, Cohn, Price, Holman & Stern

[57] ABSTRACT

An inner surface of each of the side walls of a basket for processing thins plates is provided with plural rod-like projections extending inwardly in opposite directions to each other acting as a space holding member, a plurality of these rod-like projections are arranged in spaced apart relation along an inserting direction of the thin plates so as to form a group of rod-like projections, the groups of rod-like projections are arranged in side-by-side relation with a specified pitch for every spacing of the spaced-apart thin plates, the thin plates are inserted between adjoining groups of rod-like projections, thereby a flowing communication of the processing liquid or air is further improved as compared with the space holding member made by the continuous partition wall of the prior art, resulting in that an etching process or a centrifugal drying for the stored thin plates can be performed efficiently.

11 Claims, 6 Drawing Sheets

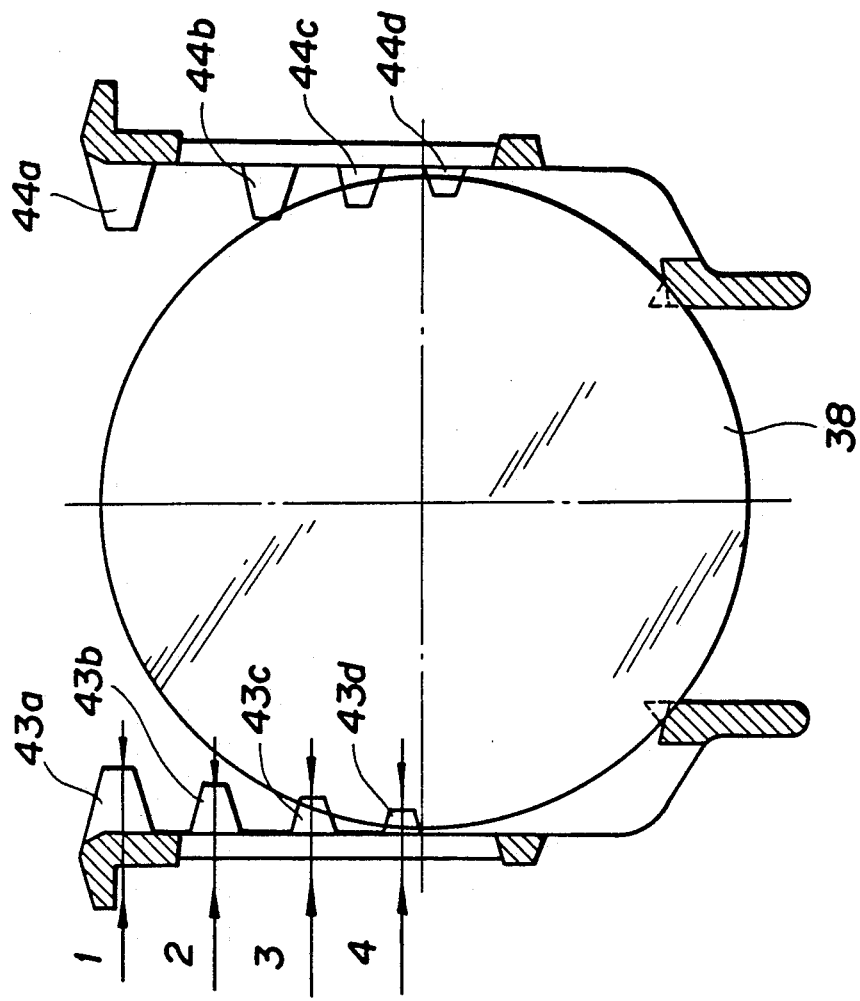

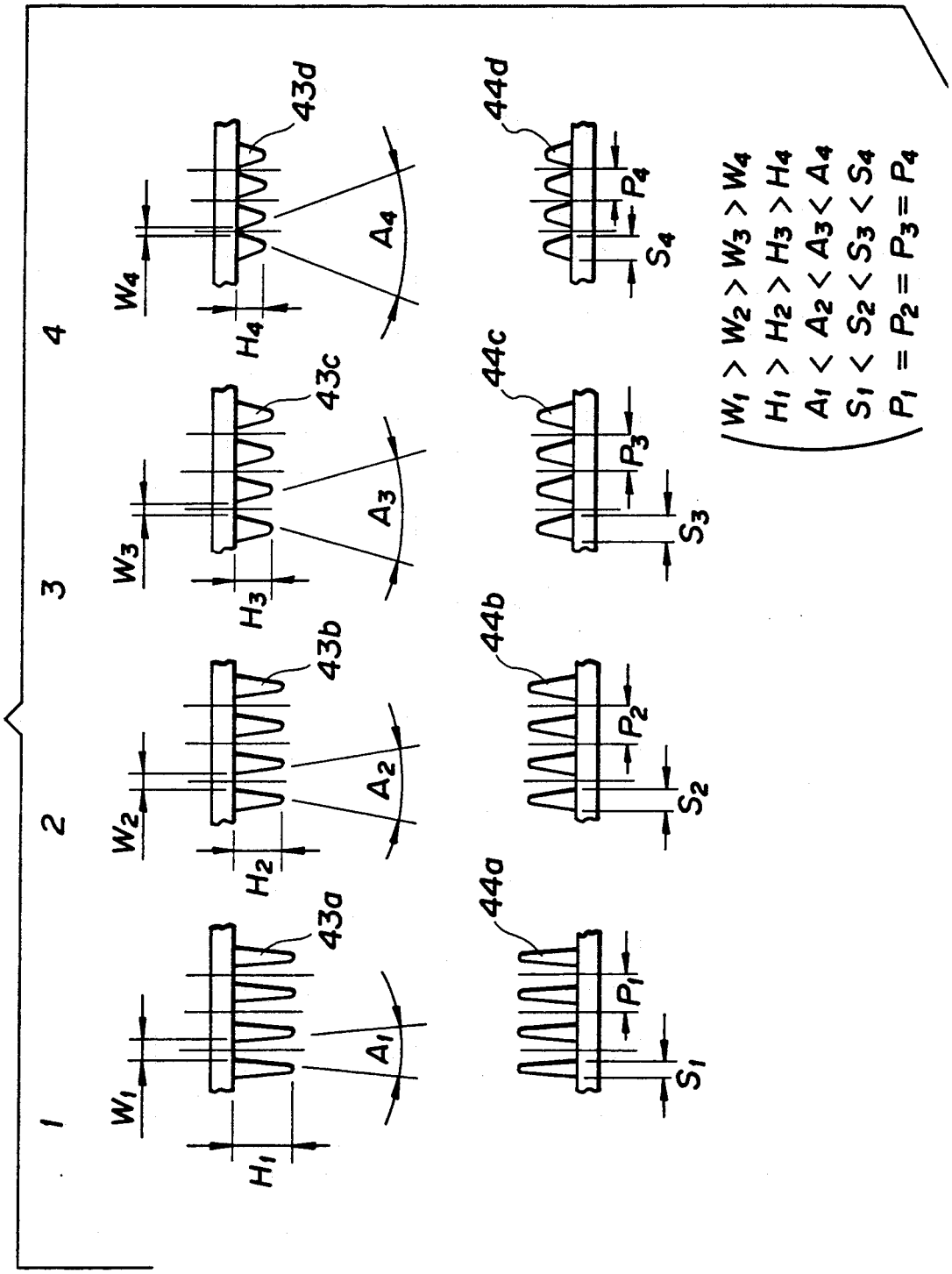

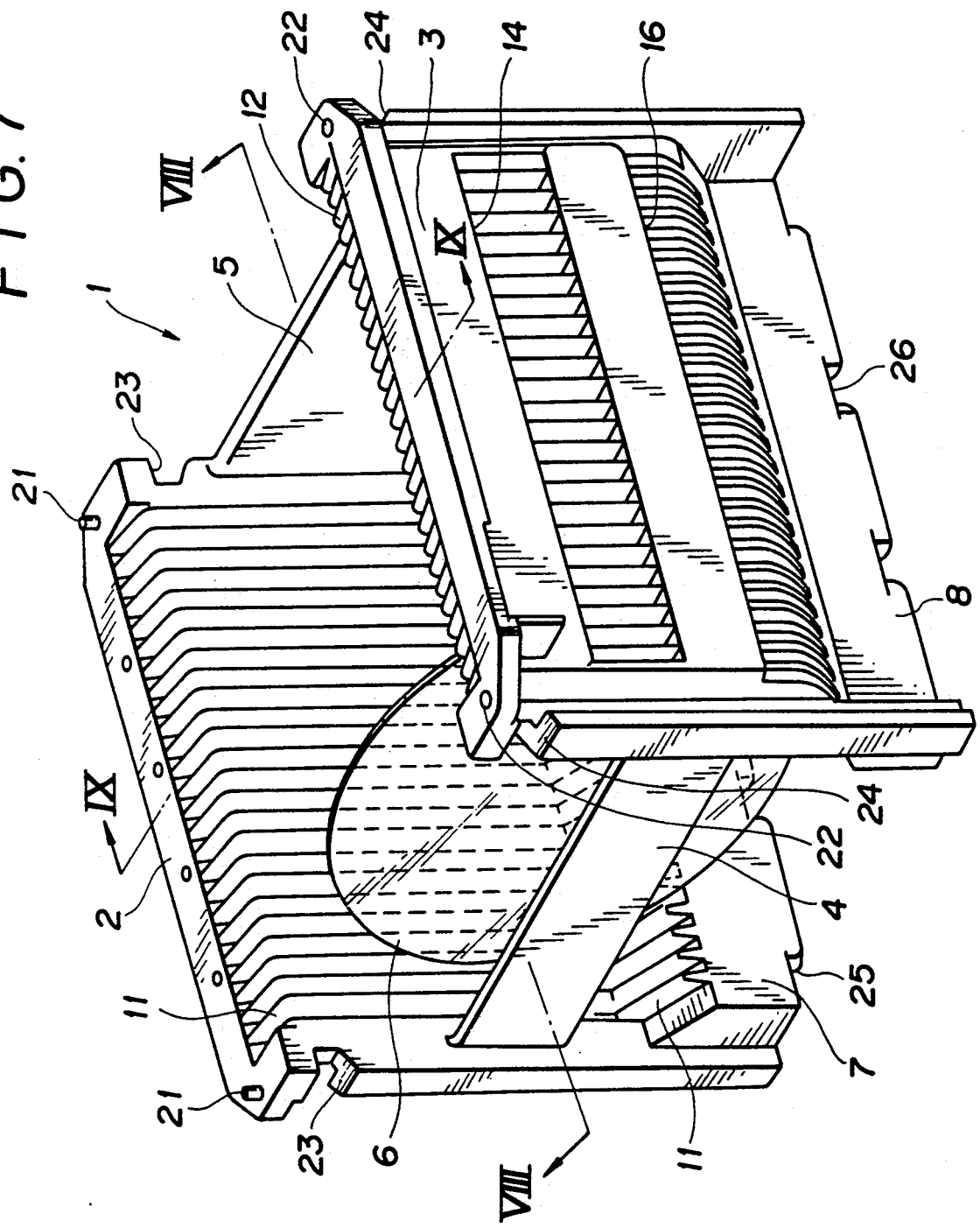

BASKET FOR PROCESSING THIN PLATES

BACKGROUND OF THE INVENTION

1. Field of the Invention

This invention relates to a basket for processing thin plates in which plural thin plates to be used in a semiconductor wafer, a glass mask, a recticle and a compact disc or the like are arranged and stored in parallel and then some processings such as a cleaning, an etching and a drying or the like are carried out for these stored thin plates.

2. Description of the Prior Art

Various types of structure have been proposed for this kind of basket in the prior art and their typical structures are described in reference to FIGS. 7 to 9. A basket 1 is integrally formed with plastics having superior heat-resistance and antichemical characteristic, for example, a fluorine resin material. The basket 1 has a rectangular shape which is enclosed by each of parallel opposing side walls 2 and 3 and end walls 4 and 5 connecting each of both side ends of each of the side walls 2 and 3. Below the side walls 2 and 3 is formed each of foundation blocks 7 and 8 which are bent inwardly and reduced their interval to prevent each of several thin plates 6 stored in parallel to each other from being dropped. Arcuate surfaces of the thin plates 6 are engaged with the inclined surfaces of the foundation blocks 7 and 8 and supported by them.

Plural continuous partition walls 11 and 12 acting as a space holding member for arranging plural thin plates 6 in parallel to each other with a desired spacing therebetween are projected inwardly in parallel at the inner surfaces of the side walls 2 and 3 and the foundation blocks 7 and 8. In addition, insertion grooves 9 and 10 for storing the thin plates 6 therein are formed between the partition walls 11 and 12.

Further, the side walls 2 and 3 and the foundation blocks 7 and 8 are provided with longitudinal rectangular window holes 13, 14, 15 and 16, respectively, and wall surfaces are cut away by the window holes 13, 14, 15 and 16 so as to form each of slits 17, 18, 19 and 20. Each of these slits 17, 18, 19 and 20 may act as a communication hole for communicating across the side walls 2 and 3 and the foundation blocks 7 and 8 so as to make a flowing of processing liquid or air in respect to the stored thin plates 6.

Reference numeral 21 denotes projections of small diameter and reference numeral 22 denotes holes of small diameter which are used in case that the thin plates stored in one basket are transferred to another basket. When the two baskets are abutted to each other, the projection 21 of small diameter and the holes 22 of small diameter are fitted to each other and then their positions are set. Reference numerals 23 and 24 denote holding recesses to which holder tools are engaged in case the basket having plural thin plates stored therein is immersed into processing liquid or pulled out of the processing liquid.

Reference numerals 25 and 26 denote engaging recesses to which a transporting mechanism of a conveyor is engaged in case the basket is to be transported by the conveyor or the like to a next stage.

Plural thin plates 6 stored in the basket 1 are etched or cleaned through a spraying process or immersed in processing liquid through an immersion process or dried in a centrifugal dryer. During these processes, it is preferable for processing liquid or drying air to be uniformly contacted with the entire surfaces of the thin plates 6 and at the same time to have a uniform flowing liquid or air.

However, the space holding structure for storing the plates in the insertion grooves 9 and 10 formed by the continuous partition walls 11 and 12 from the side walls 2 and 3 to the foundation blocks 7 and 8 in order to make an alignment of the thin plates 6 as indicated in the prior art had the following disadvantages. That is, the partition walls 11 and 12 are constructed such that the processing liquid or air is prevented from being flowed to generate staying phenomenon or air bubbles, they are contacted with the thin plates 6 at their wide area, liquid removal after processing is deteriorated, a uniform processing may not be attained, some irregular dried portions are generated and mist-like fine particles may easily be adhered to the thin plates 6.

In view of the foregoing, it is an object of the present invention to solve the above-mentioned problems of the prior art and to provide a basket for processing thin plates in which a uniform and superior processing can be attained.

It is also an object of the present invention to provide a basket for processing thin plates in which a partition wall is eliminated.

It is also an object of the present invention to provide a basket for processing thin plates in which staying phenomenon of processing liquid caused by grooves between the partition walls or air bubbles are not generated.

It is also an object of the present invention to provide a basket for processing thin plates in which a superior liquid removal after processing of thin plates is attained, irregular dried surfaces are not generated and a uniform processing can be attained.

It is also an object of the present invention to provide a basket for processing thin plates in which processing liquid or dried air is uniformly contacted with entire surfaces of the thin plates in an etching or cleaning process or a drying process.

It is also an object of the present invention to provide a basket for processing thin plates in which space holding members are formed of such a shape or an arrangement as one suitable for etching or cleaning and drying of thin plates stored in the basket.

It is also an object of the present invention to provide a basket for processing thin plates in which the thin plates may easily be inserted into the basket and an alignment of the thin plates to be held is improved.

SUMMARY OF THE INVENTION

A first gist of this invention consists in an arrangement in which plural rod-like projections are projected inwardly in opposite directions to each other as space holding members at an inner surface of each of side walls of the basket for processing thin plates, these rod-like projections are arranged along an inserting direction of the thin plates in spaced-apart relation so as to form a group of rod-like projections, the groups of rod-like projections are arranged in side-by-side relation with a specified pitch for every spacing where the thin plates are spaced apart and the thin plates are inserted between adjoining groups of rod-like projections. With this arrangement, a communication of flow of the processing liquid or air is improved more as compared with the prior art of the space holding member made by the continuous partition walls and then an etching process or a centrifugal drying process for the stored thin plates can be performed well.

A second gist of the present invention consists in a formation in which the rod-like projections acting as the above-mentioned space holding member are formed to be gradually reduced in their diameters toward their extremity ends. With this arrangement, a contact area in respect to the stored thin plates is reduced to improve a communication flow of the processing liquid and air.

A third gist of the present invention consists in an arrangement in which a sectional shape of the above-mentioned rod-like projections is either a circular one or an elliptical one. In this way, a contact area in respect to the stored thin plates is reduced to cause a flow communication of the processing liquid or the air to be improved more.

A fourth gist of the present invention consists in an arrangement in which the above-mentioned rod-like projection group are composed of each of the rod-like projections having a specified diameter of its base part, a height of the rod-like projections positioned at an inserting inlet of the above-mentioned thin plates is made as the highest one and at the same time their heights are gradually decreased in sequence as they are transferred to their bottom portions. With this arrangement, an accuracy of insertion or positioning of the thin plates is improved and at the same time a contact area in respect to the stored thin plates is reduced and then a flow communication of the processing liquid or air is further improved.

A fifth gist of the present invention consists in an arrangement in which the above-mentioned rod-like projection group are constructed by each of the rod-like projections having a specified height, a diameter of the base part of the rod-like projection located at the inserting inlet of the above-mentioned thin plates is made to have the smallest size and diameters of the base portions of the projections are gradually expanded in sequence as they are transferred to their bottom part. With this arrangement, an accuracy of insertion of the thin plates or their locating operation is improved and at the same time a contact area in respect to the stored thin plates is reduced and a flow communication of the processing liquid or air is further improved.

A sixth gist of the present invention consists in an arrangement in which a group of the above-mentioned rod-like projections is constituted by each of the rod-like projections having a different height and a different diameter to each other, the rod-like projections located at the inserting inlet side of the above-mentioned thin plates are formed to have the smallest diameter at the base ends and the highest height and the diameters of the base ends are gradually expanded and the heights are gradually reduced in sequence as they are transferred to their bottom sides. With this arrangement, an accuracy of inserting the thin plates or their positioning is improved and a contact area in respect to the stored thin plates is reduced and a flow communication of the processing liquid or air is further improved.

A seventh gist of the present invention consists in an arrangement in which each of the rod-like projections of adjoining groups of rod-like projections is arranged at an alternative displaced position. In this way, the stored thin plates can be held by a less number of rod-like projections and at the same time a contact area is reduced and a flow communication of the processing liquid or air can be further improved.

An eighth gist of the present invention consists in an arrangement in which an inserting inlet side of the above-mentioned thin plates has a guiding space formed by arranging the rod-like projections or partition walls in side-by-side relation so as to guide the thin plates into the insertion space for each of the thin plates formed by the above-mentioned groups of rod-like projections. With this arrangement, an accuracy of inserting the thin plates or their positioning can be improved.

BRIEF DESCRIPTION OF THE DRAWINGS

FIG. 4 is a partial cross-sectional view of the basket of FIG. 1.

FIG. 5 is a longitudinal section of the basket according to another preferred embodiment of the present invention.

FIG. 6 is a partial section of an example in which the rod-like projections of the basket of FIG. 5 are improved.

FIG. 7 is an entire perspective view of the basket for processing the thin plates in accordance with the example of the prior art.

DESCRIPTION OF THE PREFERRED EMBODIMENT

Figure 1:
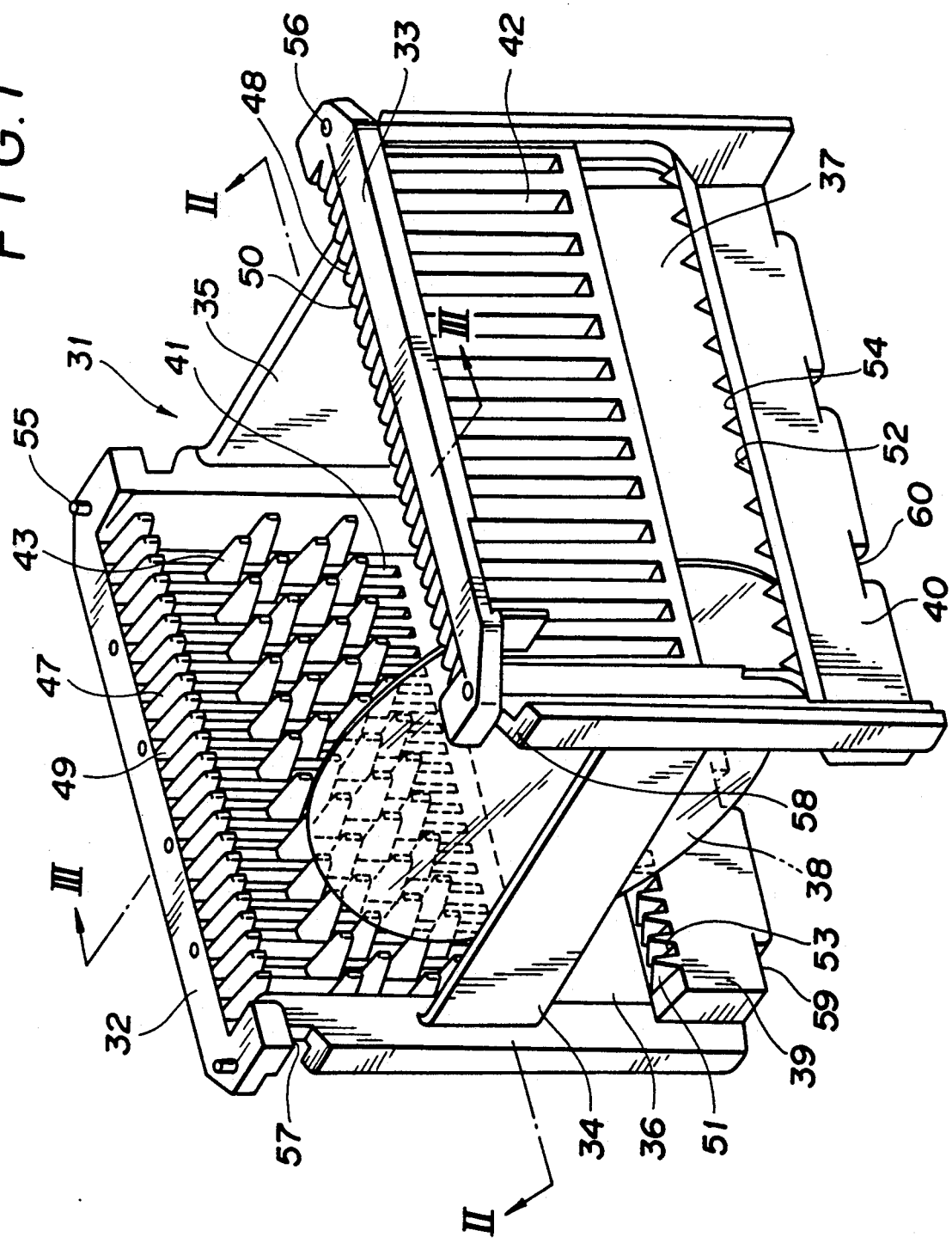
FIG. 1 is an entire perspective view of a basket for processing thin plates according to a preferred embodiment of the present invention.
Figure 2:
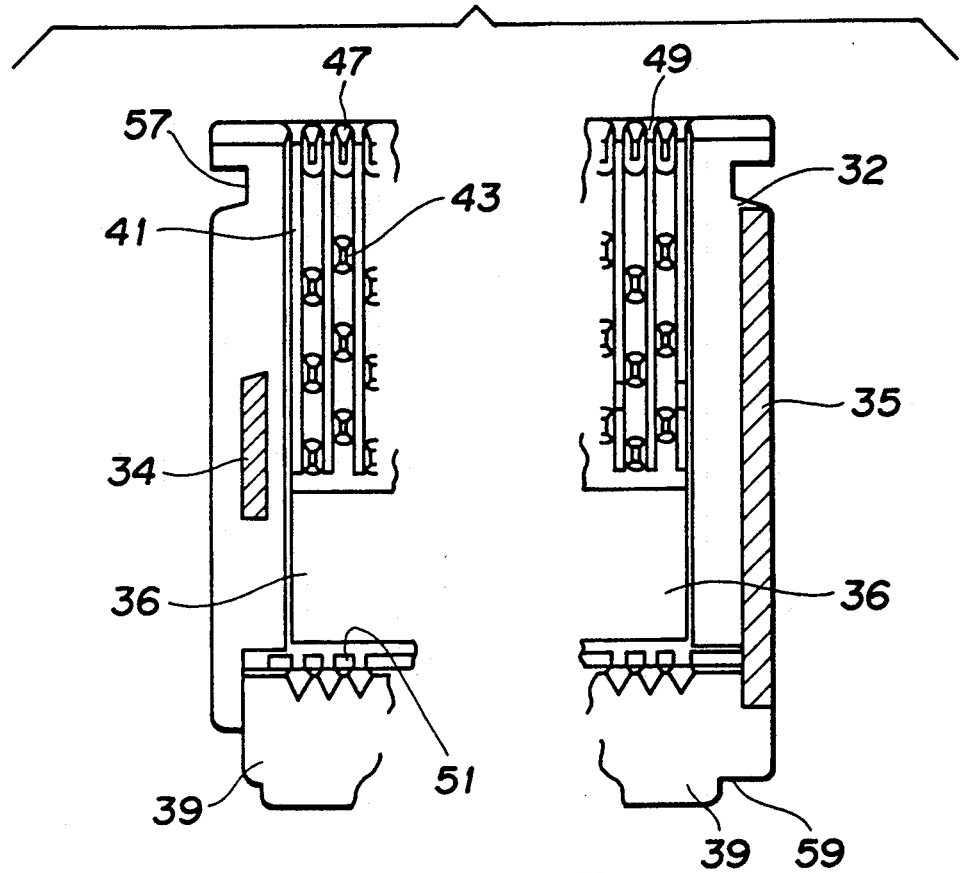
FIG. 2 is a longitudinal section taken along a line II—II of FIG. 1 with a part of the basket of FIG. 1 being eliminated.
Figure 3:
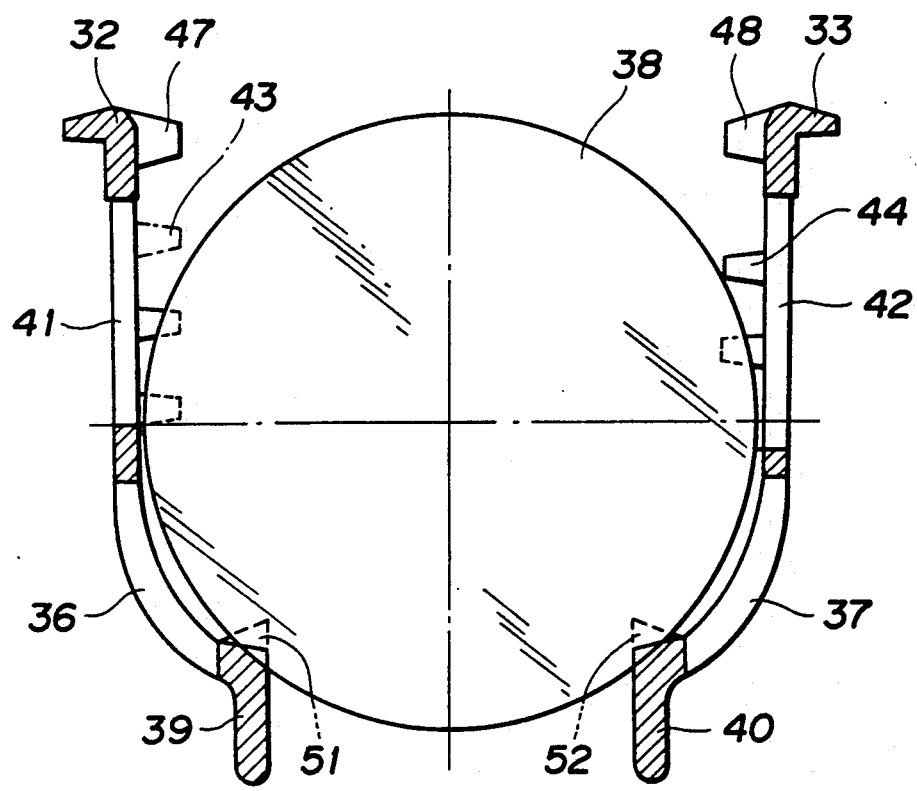
FIG. 3 is a longitudinal section taken along a line III—III of the basket of FIG. 1.
Figure 8:
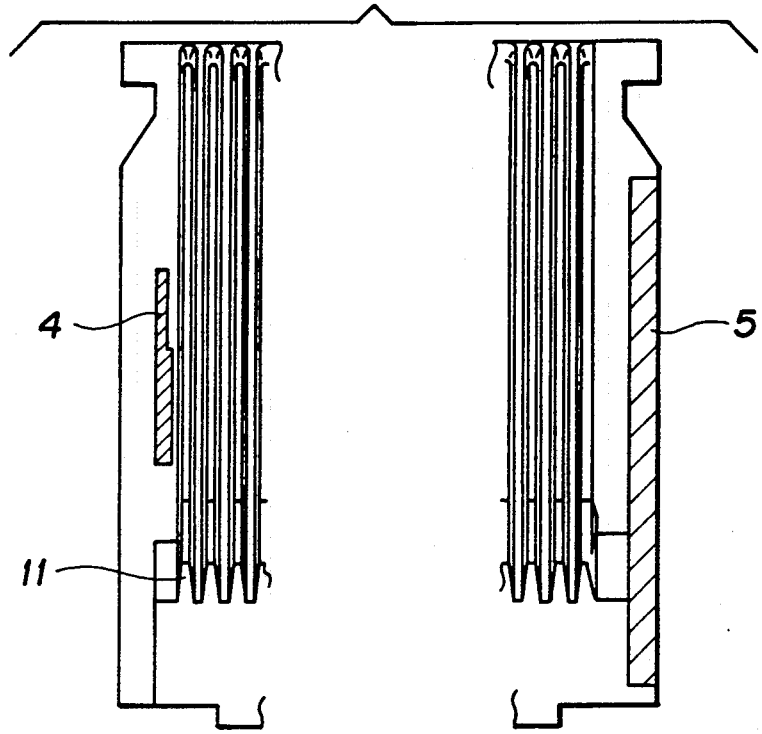
FIG. 8 is a longitudinal section taken along a line VIII—VIII of FIG. 7 with a part of the basket being eliminated.
Figure 9:
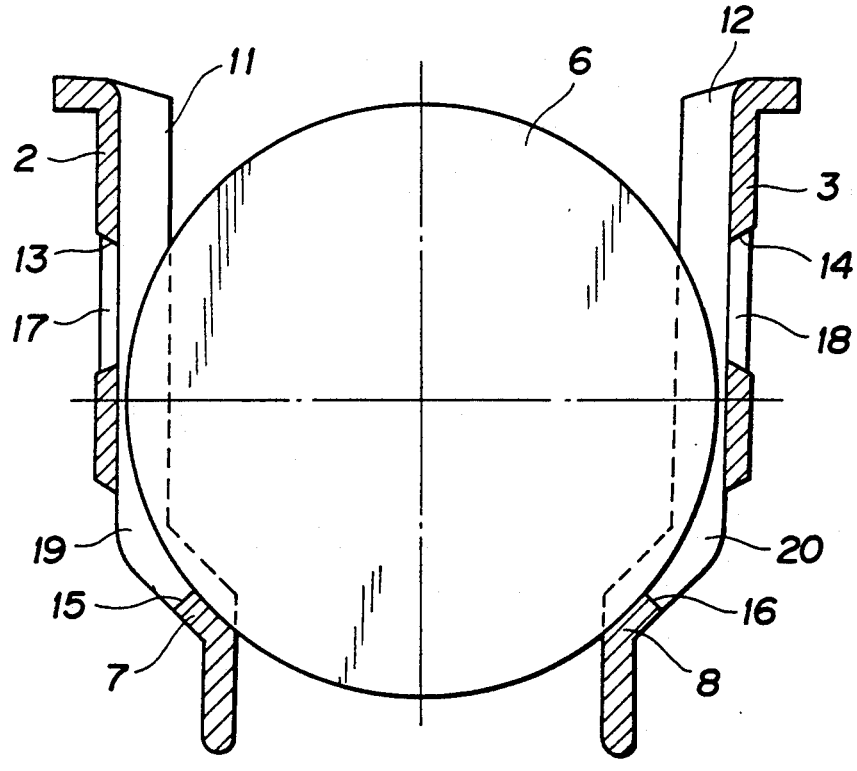
FIG. 9 is a longitudinal section taken along a line IX—IX of FIG. 7.
Figure 10:
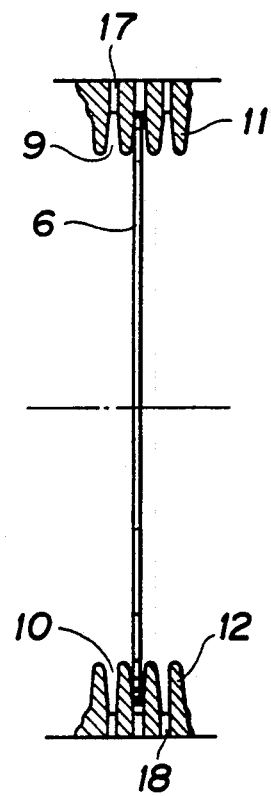
FIG. 10 is a partial cross-sectional view of the basket of FIG. 7.

Referring now to FIGS. 1 to 6, a preferred embodiment of the present invention will be described. A basket 31 is integrally formed of plastics, for example, a fluoric resin material which is superior in heat-resistant characteristic or anti-chemical characteristic similar to the prior art and has a rectangular shape in which the side ends of each of side walls 32 and 33 are connected by each of the end walls 34 and 35, respectively.

Each of rectangular window holes 36 and 37 is opened along a longitudinal direction of the basket 31 below the side walls 32 and 33 so as to form a flow communication hole for improving a flow of the processing liquid or air. Further, below the window holes is formed each of foundation blocks 39 and 40 which is bent inwardly and converge so as to prevent the stored thin plates 38 from being dropped. Each of the above-mentioned side walls 32 and 33 is formed with plural vertical slits 41 and 42 arranged in side-by-side relation so as to act as a communication hole for improving a flow of the processing liquid or air, the slits being opened in a desired spacing along a longitudinal direction of the basket 31. Side wall surfaces between each of slits 41 and 42 are provided with plural rod-like projections 43 and 44 projected inwardly in opposite directions to each other so as to act as a space holding member for use in aligning the thin plates 38 and spacing them apart in parallel with a specified pitch.

A plurality of the above-mentioned rod-like projections 43 and 44 are arranged along an inserting direction of the thin plates 38 and spaced apart to form a group of sets of rod-like projections. The group of rod-like projections may cooperate with another group of rod-like projections adjoining under a specified pitch in a longitudinal direction of the basket 31 to form the insertion spaces 45 and 46 for the thin plates 38.

The rod-like projections 43 and 44 may have various shapes and arrangements. For example, they may have a rectangular section with their base portions and extremity end portions having a specified diameter to each other. In order to reduce a contact area with the thin plates 38 and improve a flowing operation of the processing liquid or air, it is preferable to have a column-like shape with a circular or elliptic section and further it is preferable to have a conical shape with its extremity end being gradually reduced in its diameter as shown in the preferred embodiment.

Although the group of the rod-like projections may be formed by each of the rod-like projections having the same shape to each other with diameters of their base portions being constant and their heights being equal to each other, the shape and arrangement of each of the rod-like projections constituting the above-mentioned group of rod-like projections can be modified optionally in order to improve a flow operation of the processing liquid or air and to improve an accuracy of an inserting or a position setting of the thin plates. For example, as shown in FIG. 5, it may also be available that the heights of the rod-like projections 43a and 44a positioned at the inserting inlet of the thin plates is made as the highest one and the heights of each of the rod-like projections 43b, 43c and 43d and each of the rod-like projections 44b, 44c and 44d are reduced in sequence as they are transferred to bottom portion.

As another example, as shown in FIG. 6, the rod-like projections 43a and 44a positioned at the inserting inlets of the thin plates may be made such that the their base portions have the smallest diameter $S_1$ and the highest height $H_1$. Diameters $S_2$, $S_3$ and $S_4$ of their base portions of each of the rod-like projections 43b, 43c and 43d and each of the rod-like projections 44b, 44c and 44d may be gradually expanded in sequence as they are transferred to the bottom portion, and in turn the heights $H_2$, $H_3$ and $H_4$ may be gradually reduced in sequence. Such an arrangement as described above in which the basket is provided with each of rod-like projections having the height H and diameter S different to each other enables the insertion of the thin plates 38 to be facilitated due to the fact that a spacing $W_1$ at the base portion of each of the adjoining rod-like projections having a spacing of a specified pitch P at the inserting inlet of the thin plates is wide and an opening angle $A_1$ is gentle and further the height $H_1$ is high. In addition, since the bottom part has a narrow spacing W, an acute opening angle A and a low height H, the stored thin plates 38 are held in a stable manner with a less contact area and so a flowing characteristic of the processing liquid or air is further improved to provide a quite efficient effect.

Although not shown, the present invention can be provided by each of the rod-like projections having a specified height in which diameters at the base portions of the rod-like projections positioned at the inserting inlet of the thin plates are made as the smallest one and their diameters at the base portions are increased in sequence toward the bottom portions.

Although either the rod-like projection 43 or the rod-like projection 44 of a group of each of the adjoining rod-like projections may be arranged similarly to hold the same positions from front and rear surfaces of the inserted thin plates 38, it is preferable to make an alternative displacement of the rod-like projections in order to make a more superior flowing action of the processing liquid or liquid removal or dried air. In this way, if the group of each of the adjoining rod-like projections is arranged at its alternative displaced positions, an inserting characteristic of the thin plates 38 or their alignment characteristic after insertion may not be reduced even if the number of rod-like projections constituting the group of rod-like projections is reduced to a half number. In addition, in order to improve an inserting characteristic of the thin plates 38 and an alignment characteristic after insertion, it may also be available that an arrangement of the groups of rod-like projections at the side wall 33 is displaced to an alternative position in respect to the groups of rod-like projections at the side wall 32 as shown in FIG. 4.

Each of the side walls 32 and 33 at an inlet side where the above-mentioned thin plate 38 are inserted has rod-like projections 47 and 48 similar to the rod-like projections 43 and 44 arranged in side-by-side relation to form guide spaces 49 and 50. Each of the thin plates 38 inserted through the guide spaces 49 and 50 is guided into each of the inserting spaces 45 and 46 formed by the groups of the rod-like projections. In place of the rod-like projections 47 and 48, short partition walls may be arranged in side-by-side relation to form each of the guiding spaces or the group of rod-like projections 43 and 44 alternatively displaced to each other may be disposed up to the inlet port of each of the side walls 32 and 33 where the thin plates 38 are inserted.

Although each of the thin plates 38 inserted into each of the inserting spaces 45 and 46 as described above is supported on the slant surfaces of the foundation blocks 39 and 40 with their arcuate surfaces, triangular engaging projection pieces 51 and 52 may be projected from the slant surfaces of the foundation blocks 39 and 40. The engaging projecting pieces 51 and 52 are arranged in side-by-side relation along a longitudinal direction of the basket 31 in the same spacing as that of the rod-like projections 43 and 44 and then between the adjoining engaging projecting pieces are formed the insertion grooves 53 and 54 for use in inserting each of the thin plates 38. In place of the above-mentioned engaging projecting pieces 51 and 52, the rod-like projections similar to the rod-like projections 43 and 44 may be projected in a side-by-side relation from the slant surfaces of the foundation blocks 39 and 40 to form the inserting space for use in inserting each of the thin plates 38.

In addition, the basket 31 is provided with small-diameter projections 55 and small diameter holes 56 for use in position setting in case of replacing the thin plates, holding recesses 57 and 58 to which the holding tools are engaged, and engaging recesses 59 and 60 to which a transferring mechanism of a conveyor is engaged, as required, in the same manner as that of the prior art.

Within the basket 31 constructed above are stored plural thin plates 38 while they are inserted into the inserting spaces 45 and 46 and the inserting grooves 53 and 54 through the guiding spaces 49 and 50 and aligned to each other and during this operation, the spacing holding member of each of the rod-like projections 43 and 44 may perform a stable holding of each of the thin plates 38 and may contribute to a uniform cleaning or etching or a centrifugal drying operation and the like.

As apparent from the above-mentioned preferred embodiment, since the present invention is constructed such that the thin plates are inserted between groups of rod-like projections arranged in spaced-apart relation at the side wall surfaces, phenomenon of staying processing liquid or generation of air bubbles is reduced as compared with the conventional type of structure in which the thin plates are inserted into the grooves formed between the continuous partition walls so as to improve a flowing characteristic of the processing liquid and at the same time the rod-like projections are contacted with the thin plates under a near point contact state, the liquid removal after processing is superior and so an uniform processing can be attained.

Utilization of the rod-like projections as the space holding member enables the basket to have the most suitable shape or arrangement as one for etching or cleaning and drying of the stored thin plates.

In addition, either the guiding space formed by arranging the rod-like projections or partition walls in side-by-side relation or guiding grooves as well is provided at an inserting inlet port for the thin plates to cause each of the thin plates to be guided into the inserting space formed by the group of rod-like projections, thereby the insertion of the thin plates may easily be performed and their alignment characteristic can be improved.

Various modifications and improvements of the present invention can be attained and a scope of the present invention is limited by the claims only.

What is claimed is:

1. In a basket for processing thin plates, said basket comprising
    a rectangular container having an upper and a lower opening and parallel side walls interconnected by parallel end walls for use in storing said thin plates,
    each of the parallel side walls including space holding members engaged with opposite sides of each of the thin plates to align the thin plates in side-by-side relation and to space the thin plates apart,
    each of said side walls including a foundation block located to define said lower opening therebetween and to support with minimal contact a lower portion of the thin plates, said foundation block projecting inwardly toward a central region of said container, and a plurality of vertical slits located above said foundation block defining flowthrough openings,
    an inner surface of each of said side walls located between said vertical slits being provided with plural rod-like projections extending inwardly in opposite directions to each other toward the central region to form the space holding members,
    said rod-like projections being arranged in spaced-apart relation along an inserting direction of the thin plates so as to form a group of said rod-like projections, and said group of said rod-like projections being arranged in spaced side-by-side relation along a longitudinal direction of the container for receiving the thin plates between adjoining groups of said rod-like projections.

2. A basket for processing thin plates according to claim 1, wherein said rod-like projections are formed such that the diameters thereof gradually decrease toward an extremity of their ends.

3. A basket for processing thin plates according to claim 1, wherein said rod-like projections have a circular section.

4. A basket for processing thin plates according to claim 3, wherein said group of rod-like projections is constructed by each of the rod-like projections having a specified diameter at the base portion, a height of the rod-like projection located at an inserting inlet for said thin plates is made having the greatest height and at the same time its height gradually decreases toward the bottom part.

5. A basket for processing thin plates according to claim 3, wherein said group of rod-like projections is constructed by each of the rod-like projections having a specified height, a diameter of the base part of the rod-like projection located at an inserting inlet for said thin plates is made having the smallest diameter and a diameter at the base part increases progressively toward the bottom part.

6. A basket for processing thin plates according to claim 3, wherein said group of rod-like projections is constructed by each of the rod-like projections having a different height and a different diameter, the rod-like projections located at the inserting inlet for said thin plates are made such that the diameters at the base portions are the smallest and the heights are made as the greatest and at the same time the diameters at the base portions increase in sequence toward the bottom portion and the heights decrease.

7. A basket for processing thin plates according to claim 6, wherein each rod-like projection of adjoining groups of rod-like projections is arranged at a displaced location to each other.

8. A basket for processing thin plates according to claim 7, wherein the inserting inlet for said thin plates is provided with a guiding space formed by arranging the rod-like projections in side-by-side relation so as to cause each of the thin plates to be guided into the inserting space formed by adjoining groups of rod-like projections.

9. A basket for processing thin plates according to claim 8, wherein a window hole is opened along a longitudinal direction of the container at a portion between the side wall and the foundation block.

10. A basket for processing thin plates according to claim 9, wherein said side wall is provided with vertical slits between adjoining groups of the rod-like projections.

11. A basket for processing thin plates according to claim 1, wherein said rod-like projections have a longitudinal elliptic section.

* * * * *